United States Patent [19]
Nause et al.

[11] Patent Number: 5,900,060
[45] Date of Patent: May 4, 1999

[54] PRESSURIZED SKULL CRUCIBLE APPARATUS FOR CRYSTAL GROWTH AND RELATED SYSTEM AND METHODS

[75] Inventors: Jeffrey E. Nause, Atlanta; D. Norman Hill, Chamblee, both of Ga.; Stephen G. Pope, Greer, S.C.

[73] Assignee: Cermet, Inc., Atlanta, Ga.

[21] Appl. No.: 08/675,141

[22] Filed: Jul. 3, 1996

[51] Int. Cl.$^6$ .................................................. C30B 11/02
[52] U.S. Cl. .............................. 117/223; 117/49; 117/77; 117/81
[58] Field of Search .................................. 117/49, 77, 81, 117/223

[56] References Cited

U.S. PATENT DOCUMENTS

| | | | |
|---|---|---|---|
| 3,060,123 | 10/1962 | Theuerer | 252/62.3 |
| 3,135,585 | 6/1964 | Dash | 23/301 |
| 3,340,016 | 9/1967 | Wirth et al. | 23/301 |
| 3,615,878 | 10/1971 | Chang et al. | 148/1.6 |
| 3,639,718 | 2/1972 | Castonguay et al. | 219/10.67 |
| 3,825,242 | 7/1974 | Menashi et al. | 266/39 |
| 3,865,554 | 2/1975 | Wenckus et al. | 23/273 |
| 3,985,947 | 10/1976 | Keller | 13/26 |
| 4,049,384 | 9/1977 | Wenckus et al. | 117/49 |
| 4,146,567 | 3/1979 | Munits | 422/248 |
| 4,224,100 | 9/1980 | Hartzell | 156/617 |
| 4,233,270 | 11/1980 | Schmidt | 422/249 |
| 4,264,406 | 4/1981 | Hacskaylo | 156/616 |
| 4,309,241 | 1/1982 | Garavaglia et al. | 156/613 |
| 4,330,361 | 5/1982 | Kuhn-Kuhnenfeld et al. | 156/617 |
| 4,937,053 | 6/1990 | Harvey | 422/249 |
| 5,180,562 | 1/1993 | Drechsel et al. | 422/429 |
| 5,268,063 | 12/1993 | Kaneko et al. | 117/49 |
| 5,394,829 | 3/1995 | Uesugi et al. | 117/217 |
| 5,485,802 | 1/1996 | Altekruger et al. | 117/14 |

FOREIGN PATENT DOCUMENTS

| | | |
|---|---|---|
| 04-12083 | 1/1992 | Japan . |
| 06-172031 | 6/1994 | Japan . |

OTHER PUBLICATIONS

Journal of Crystal Growth 12, (1972) pp. 125–131, authored by Oliver, Brower and Horn (GE/Schenectady).

*Primary Examiner*—Robert Kunemund
*Attorney, Agent, or Firm*—Law Office of Jon M. Jurgovan

[57] ABSTRACT

The invention is directed to an apparatus, system and methods for growing high-purity crystals of substances that are peritectic at atmospheric pressure. The apparatus includes a pressure vessel that contains a pressurized gas. The apparatus also includes a cooling unit that is situated in the pressure vessel. The cooling unit receives a coolant flow from outside of the vessel, and has cooled surfaces that define an enclosure that receives the charge material. The apparatus further includes an inductive heating element situated in the vessel, that is coupled to receive electric power externally to the vessel. The element heats the interior portion of the charge material to form a molten interior portion contained by a relatively cool, exterior solid-phase portion of the charge material that is closer relative to the molten interior, to the cooled surfaces of the cooling unit. Because the exterior portion is the same material as the contained molten interior portion, few impurities are introduced to the molten interior portion of the charge material. Due to the pressure exerted by the gas contained in the vessel, the liquid interior of the charge material becomes congruently melting to prevent its peritectic decomposition. Therefore, crystals of substances that are peritectic at atmospheric pressure, can be produced from the liquid phase with the apparatus of this invention. In addition to electric power, the heating element receives a coolant flow from a feedthrough that extends through a wall of the pressure vessel. In proximity to the vessel wall, the feedthrough has two coaxial conductors to improve the electric power transfer to the heating element and to reduce heating of the external surfaces of the vessel. The two conductors of the feedthrough are cylindrical in shape, and define two channels for channeling a coolant flow to and from, respectively, the heating element. A shield formed of a cylindrical sheet of metal, for example, is positioned in the vessel to surround the heating element to focus energy emitted by the element to the charge material.

48 Claims, 5 Drawing Sheets

5,900,060

PRESSURIZED SKULL CRUCIBLE APPARATUS FOR CRYSTAL GROWTH AND RELATED SYSTEM AND METHODS

STATEMENT OF GOVERNMENT RIGHTS IN THE INVENTION

This invention was made pursuant to a Small Business Innovative Research project funded by the U.S. Government as represented by the Department of Army under Contract No. DAAH 04-94-C-0074 (Phase I). The U.S. Government has certain rights in the invention.

BACKGROUND OF THE INVENTION

1. Field of the Invention

The invention is directed to an apparatus, system and methods for growing crystals of a substance from its liquid phase. The crystals grown in accordance with this invention have highly-ordered atomic structures with few impurities or defects, and thus are suitable, for example, for the production of wafer substrates used for the manufacture of semiconductor or optical devices or the like, or for the production of superconductive materials.

2. Description of the Related Art

For decades, researchers have attempted to grow high-purity crystals of substances that undergo peritectic reactions, from a melt. These attempts have proved unsuccessful, however, because substances that behave peritecticly, by their nature, decompose upon solidification from the liquid phase into non-stoichiometric compositions from which a crystal cannot be grown without significant lattice defects due to local variations of the quantities of the various elements and/or compounds that compose the substance. The difficulties of growing crystals of peritectic substances from a melt have been widely recognized. For example, one researcher has noted that the ". . . freezing of a peritectic reaction (or compound), to complete equilibrium, is practically impossible to attain." W. J. Boettinger, Mettalurgical Transactions Vol. 5, pg. 2023, published 1974. Another commentator noted that researchers are exhibiting "a very lively interest" in peritectic reactions, but the ability to control these reactions has alluded many. D. H. St. John, L. M. Hogan, Acta Metallurgica Vol. 25, pg. 77, published 1977. Even more recently, a textbook indicates that many substances decompose peritecticly when melted into a non-stoichiometric liquid with an indeterminate ratio of components or elements. James F. Shackleford, *Introduction to Materials Science for Engineers*, Macmillan Publishing Company, New York, Third Edition, pg. 222, published 1992. Similar observations regarding the freezing of substances that undergo peritectic reactions have been made in a number of publications. See, for example, J. P. Schaffer, A. Saxena, S. D. Antolovich, T. H. Sanders, Jr., S. B. Warner, *The Science and Design of Engineering Materials*, Richard D. Irwin, 1995, pp. 274–76; R. Glardon, W. Kurz, Journal of Crystal Growth 51, 283, published 1981; M. Hillert, *Solidification and Casting of Metals*, The Metal Society, London, published 1979; D. H. St. John, L. M. Hogan, Acta Metallurgica 35, 171, published 1987; F. N. Rhines, Phase Diagrams in Metallurgy, McGraw Hill, New York, 1956, pp. 85–88.

FIG. 1 is a phase diagram explaining the behavior of a substance which undergoes a peritectic reaction as the substance is cooled at constant pressure and volume from the liquid- or gas- to the solid-phase. As used in this document, a peritectic (or synonymously, a 'peritectic-type' reaction) is defined as a reaction ". . . in which one phase decomposes with rising temperature into two new phases." Frederick N. Rhines, *Phase Diagrams in Metallurgy: Their Development and Application*, McGraw-Hill Book Company, New York, Pg. 83, published 1956. Thus, although some scientists in this field refer to a 'peritectic reaction' as one in which a solid decomposes with rising temperature into a solid and a liquid, the term 'peritectic' as used in this document consistent with Rhines' definition, refers to decomposition with rising temperature from any one phase into any two phases. The substance of FIG. 1 includes components A and B that can be elements or compounds, contained within a specific volume at a specific pressure. With substances that contain more than two components, many different phases are possible, so the substance in FIG. 1 is a relatively simple example provided for ease in illustrating a substance that undergoes a peritectic reaction.

At the start temperature, the peritectic substance is in the liquid or gas phase with a composition AB, where A and B denote respective proportions of the element(s) or compound(s) that comprise the peritectic substance. As the substance cools to the peritectic temperature $T_P$, the element or compound B begins to precipitate as a solid out of the liquid or gas phase, causing the remaining liquid or gas to become relatively rich in A and depleted in B. As more heat is extracted from the liquid substance, the B component of the peritectic substance continues to precipitate or sublimate out of the liquid or gas phase until the proportion of A to B reaches a composition A'B' determined by the shape of the phase boundary. At this point, as further heat is extracted from the substance, the remaining liquid or gas will precipitate or sublimate to form a solid composition A'B' that is richer in A and depleted in B relative to the initial composition AB.

From FIG. 1, the problem presented when attempting to solidify a substance which undergoes a peritectic reaction can be readily understood. Assuming that the initial composition AB was selected with a stoichiometric proportion of A to B, the behavior of the composition as heat is extracted from the system results in the initial formation of component B and the eventual formation of the non-stoichiometric composition A'B'. The resulting solid phase will therefore contain inclusions of B in a matrix of composition A'B', which is extremely unlikely to have the same physical and/or chemical properties as the desired compound AB.

There are many crystalline substances which undergo a peritectic reaction at atmospheric pressure, that are significantly important (or have significant promise of being important) for use in a wide variety of industries. For example, substances such as aluminum nitride (AlN), silicon carbide (SiC), gallium nitride (GaN), yttrium barium cupric oxide ($YBa_2Cu_3O_x$) and aluminum gallium nitride ($AlGaN_x$) are known or believed to have significant uses for a wide variety of semiconductor, optical or superconductor applications, if available in highly pure crystalline form. With respect to gallium nitride (GaN), one writer has commented that "gallium nitride substrates are the great hope of the nitride community . . . ", and that ". . . good results [obtained with nitride light-emitting diodes] would be immediately pushed forward in one large step if high quality gallium nitride substrates were to become available." G. W. Wicks, *Growing Interest in Nitrides*, Compound Semiconductor, v.2, n.1, pg. 42, January–February 1996. However, due to the extremely slow production rates (typically on the order of microns per hour) at which these peritecticly-behaving substances can be produced using vapor growth techniques, these substances are relatively scarce and expensive. Therefore, the benefits derived through the use of these high-purity, crystalline substances, have been greatly limited by the general unavailability of these substances at reasonable cost. Accordingly, there is a strong need for a device or technique for rapidly growing high-purity, crystalline substances that undergo peritectic reactions if they are attempted to be grown with conventional devices or techniques.

Another problem related to this invention involves safety concerns posed by many crystal-growing devices. More specifically, the furnace chamber surfaces of a crystal-growing device are heated to extremely high temperatures, and pressurized to relatively high pressures, to grow many kinds of substances in vapor phase processes. If the external surfaces of the furnace chamber are not cooled, these heated surfaces can become weakened and rupture under the pressure of the gas contained in the furnace chamber, thus presenting a significant risk of injury to persons in a work environment by explosion of the furnace. To reduce the danger of injury, cooling equipment has been used to cool the furnace chamber surfaces of a crystal-growing device. However, the cooling equipment system generally adds significant expense and complexity to the crystal-growing device. It would therefore be desirable to provide a crystal-growing apparatus that operates with relatively cool external surfaces, but which does not require additional cooling equipment and the expense and complexity associated therewith.

Still another problem related to this invention pertains to energy consumption required in previously known crystal-growing devices. Specifically, in order to produce the extremely high temperatures needed to melt a charge material used to grow a crystal, the typical crystal-growing device consumes considerable power. The power consumption problem of the typical crystal-growing device is exacerbated by the fact that these devices often must be operated continuously for several hours or even days to produce a single crystal. Therefore, the power consumed in previously known crystal-growing devices has added significantly to the cost of producing crystals with typical crystal-growing devices. It would be extremely desirable to reduce the amount of power required to produce a crystal.

SUMMARY OF THE INVENTION

This invention overcomes the above-noted disadvantages. In accordance with this invention, an apparatus for growing a crystal from a charge material in its liquid phase, includes a pressure vessel for containing a pressurized gas. The apparatus also includes a cooling unit for situation in the pressure vessel, that has cooled surfaces that define an enclosure to receive the charge material. The enclosure's cooled surfaces are partially opened to expose the charge material to pressure exerted by the gas contained in the pressure vessel. The apparatus further includes an induction heating element for situation in the pressure vessel, that heats an interior portion of the charge material to a molten, liquid state. The charge material's molten interior portion is contained by a relatively cool, exterior portion of the charge material that remains in the solid phase despite the heat generated by the heating element, due to its closer situation relative to the molten interior portion, to the cooled surfaces of the cooling unit. Thus, the solid, exterior portion of the charge material, referred to as a 'skull', acts as a crucible that contains the molten interior portion of the charge material. The charge material's molten interior portion can be cooled to form a crystal by reducing the amount of heat generated by the heating element, or by moving the heating element relative to the charge material so that formerly molten portions of the charge material become solidified. Importantly, the gas pressure in the vessel renders the charge material congruently melting even if the charge material is a substance that peritecticly decomposes upon solidification at atmospheric pressure. Thus, the apparatus of this invention can rapidly produce high-purity crystals of substances that undergo peritectic reactions at atmospheric pressures.

The apparatus of this invention can also include a shield situated in the pressure vessel and arranged to surround the heating element and charge material. The shield reflects and focuses energy emitted by the heating element to the charge material, for more efficient use of the energy to heat the charge material's interior portion to a molten state. The shield also prevents heating of the pressure vessel wall at locations in close proximity to the heating element. The shield is preferably composed of a material with a relatively high electrical conductivity such as copper or other suitable metal.

Also, the apparatus can include a feedthrough extending through the wall of the pressure vessel, that serves to supply electric power and coolant from outside of the pressure vessel, to the heating element that is situated inside the pressure vessel during operation of the apparatus. Preferably, the feedthrough includes a first elongated electric conductor with an inner wall that defines a conduit for channeling a coolant flow, and a second elongated electric conductor enclosing a portion of the first conductor at least in a region in which the feedthrough extends through the vessel wall. This approximately coaxial arrangement of the first and second conductors results in relatively efficient electric power transfer to the heating element for use in heating the charge material. In the feedthrough, a second conduit is defined between the outer wall of the first conductor and the inner wall of the second conductor. Inside of the pressure vessel, the conduits are coupled to supply and discharge a flow of coolant to the heating element, and the first and second conductors are electrically coupled to supply electric power to the heating element. Outside of the pressure vessel, the first and second conductors can be coupled to receive electric power from a generator, for example, and the first and second conduits are respectively coupled to receive and discharge the coolant flow, or vice versa, in a circulatory or non-circulatory manner. If the coolant is a conductive substance such as water, the feedthrough preferably includes an electrical insulator arranged to surround and contact the outer wall of the first conductor, that electrically insulates the first and second conductors from one another. If the electrical insulator is used, the second conduit is defined between an outer wall of the electrical insulator and an inner wall of the second conductor. The aforementioned shield can be electrically coupled to the second conductor that is used as an electrical ground, to increase the energy-focusing effect of the shield.

Further, the apparatus can include an actuator for moving the cooling unit relative to the heating element, so that the molten zone traverses an axis of the charge material to form an elongated crystal. In the preferred embodiment, the actuator includes a hydraulic device such as a hydraulic piston, that extends or retracts based on a hydraulic fluid flow. The hydraulic device is preferably coupled between the cooling unit and an inner wall of the pressure vessel. To prepare for a crystal-growing operation, the actuator preferably includes a hydraulic pump that can be activated to drive hydraulic fluid into the hydraulic device, causing the device to extend and move the cooling unit to a first position relative to the heating element. The actuator preferably includes a valve coupled between and communicating with the hydraulic device and pump. In the crystal-growing mode of operation, the valve can be set to a predetermined flow rate. Due to the weight of the cooling unit and the charge material situated therein, hydraulic fluid is forced out of the device at a rate determined by the valve setting. Therefore, the valve setting controls the crystal growth rate.

A system in accordance with this invention is similar to the above-described apparatus, but additionally includes the charge material that can be a substance that is peritectic at atmospheric pressure, such as gallium nitride (GaN), aluminum nitride (AlN), silicon carbide (SiC), yttrium barium cupric oxide ($YBa_2Cu_3O_x$) and aluminum gallium nitride ($AlGaN_x$).

Advantageously, with the apparatus and system of this invention, a crystal of a substance that is peritectic at atmospheric pressure, can be made to be a congruently-melting substance due to pressurization by an appropriate gas contained in the pressure vessel, that prevents the substance from decomposing by peritectic reaction when growing a crystal from the charge material in its liquid phase. Therefore, through gas pressurization, stoichiometry of the molten charge material can be maintained during solidification of the charge material so that the crystal grown with the apparatus has relatively few lattice defects. Additionally, because the crystal is grown from the liquid phase, the growth of the crystal can be performed with relative rapidity. Also, because the molten interior charge material is composed of the same substance as the cooled exterior skull portion of the charge material, relatively few impurities are introduced into the crystal grown with the apparatus of this invention. Further, the energy-focusing capability of the shield helps to prevent heating of the external surfaces of the vessel, while reducing power consumption by focusing the energy emitted by the heating element to the charge material. The feedthrough also achieves increased energy efficiency relative to conventional crystal-growing devices through the coaxial arrangement of its conductors that are coupled to supply electric power to the heating element. Also, because the feedthrough defines two conduits for channeling a coolant flow to and from the heating element, the feedthrough is cooled effectively so that the external surfaces of the pressure vessel in the vicinity of the feedthrough, are not heated to temperatures that would weaken the feedthrough or pressure vessel wall to the point of presenting a significant risk of explosion.

A first method in accordance with this invention includes steps of containing a molten liquid portion of a charge material, in a skull composed of a solid portion of the charge material, and a step of pressurizing at least the molten liquid portion of the charge material with a gas during the performance of the containing step. Preferably, the method also includes a step of cooling the molten liquid portion of the charge material to solidify the charge material to form a crystal, during the performance of the pressurizing step. Advantageously, through the use of the pressurizing step, a substance that undergoes a peritectic reaction at atmospheric pressure can be made to be congruently-melting to prevent decomposition during crystal growth. Accordingly, a crystal with proper stoichiometry, and hence relatively few crystalline lattice defects, can be produced from the substance in its liquid phase. Also, because the containing step uses a solid skull composed of the same substance as the molten charge material for the containment thereof, relatively few impurities are introduced to the crystal. Further, by performing the preferred cooling step together with the pressurizing step, peritectic decomposition of the charge material is prevented during cooling so that the molten charge material cools to a solid crystalline form with few lattice defects.

A second method in accordance with this invention includes a step of heating an interior portion of a charge material body to melt the interior portion, and a step of cooling an exterior portion of the charge material body so that the exterior portion is in a solid phase and contains the molten interior portion during the performance of the heating step. The second method also includes a step of pressurizing the charge material body with a gas during performance of the heating and cooling steps. Preferably, the second method also includes a step of cooling the molten interior portion of the charge material body to form a solid-phase crystal of the charge material. Also preferred, the heating step can be performed in a limited area along an axis of the charge material body, and the second method can include a step of moving the heat source in a direction along the axis of the material body so that a step of cooling of the interior portion of the charge material body occurs in regions previously heated by the heat source as the heat source moves along the axis of the charge material body.

Advantageously, the heating of the interior portion of the charge material body while cooling the exterior portion of the body, provides a liquid phase molten interior portion that is contained by a cooler, solid phase exterior portion of the same charge material. Thus, the exterior portion of the charge material does not introduce significant amounts of impurities into the molten interior portion of the charge material body. The pressurizing step prevents the interior portion of the charge material from undergoing peritectic decomposition upon solidification so that the second method can be used to manufacture crystals of substances that undergo peritectic reactions at atmospheric pressure. Further, the step of moving the heat source along the axis of the charge material body allows an elongated crystal to be formed so that relatively large crystals, and hence a greater quantity of useful material, can be produced by the apparatus.

These together with other objects and advantages, which will become subsequently apparent, reside in the details of construction and operation as more fully hereinafter described and claimed, reference being made to the accompanying drawings, forming a part hereof, wherein like numerals refer to like parts throughout the several views.

DESCRIPTION OF THE PREFERRED EMBODIMENTS

Figure 1:
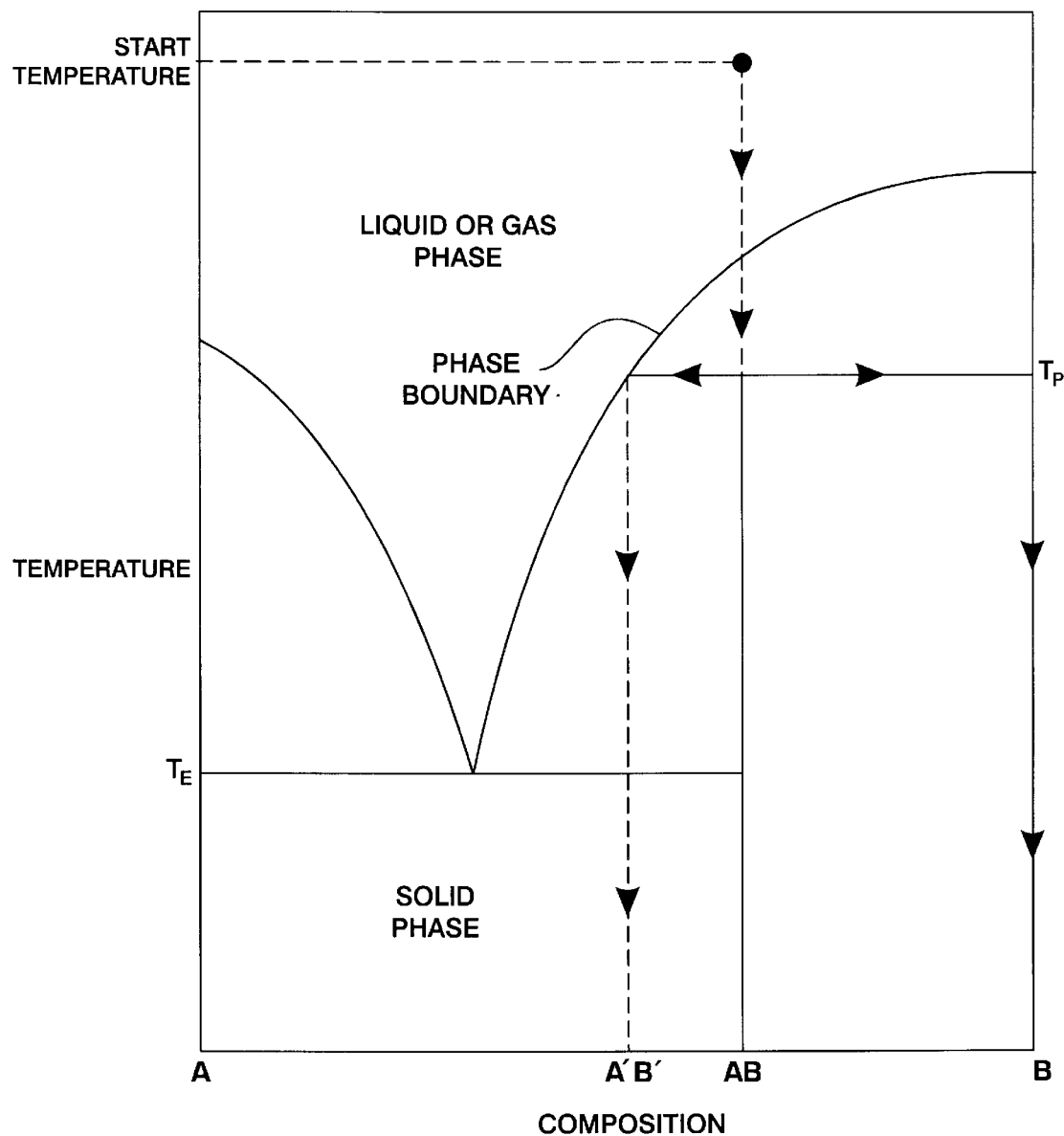
FIG. 1 is a phase diagram of a substance that undergoes a peritectic reaction.
Figure 2A:
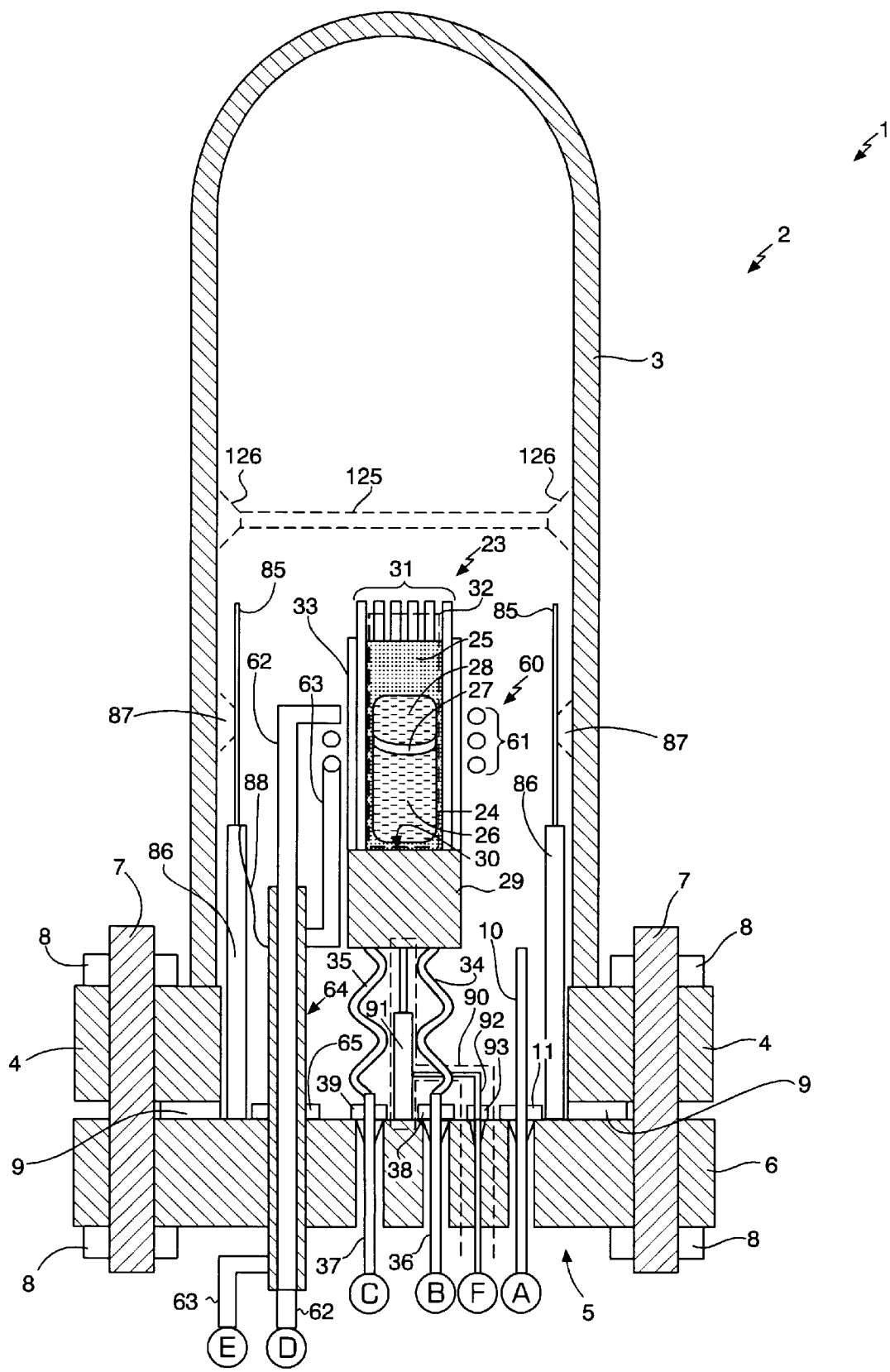
FIGS. 2A, 2B, 2C, 2D and 2E are cross-sectional views of an apparatus and system in accordance with this invention.

In FIG. 2A, an apparatus 1 in accordance with this invention includes a pressure vessel 2 that encloses a space in which a crystal is grown. Preferably, the pressure vessel 2 includes a chamber member 3 that is roughly bell-shaped, having a dome-like upper end in FIG. 1, an elongated cylindrical side wall and an outwardly extending flange 4 at its open lower end in FIG. 1. Preferably, the chamber member 3 has relatively thick steel walls (about two inches in thickness, for example) that can withstand relatively high-pressures.

To enclose the open end of the pressure vessel 2, a plate member 5 has a disc-like shape and preferably is made of steel with a thickness of several inches. The plate member 5 also defines several central apertures to receive various elements of the apparatus yet to be described in detail. At intervals about their respective circumferences, the flanges 4, 6 have corresponding apertures to receive bolts 7 that are threaded at both of their ends. The threaded ends of the bolts receive respective nuts 8. To form a pressure-tight seal between the chamber member 3 and the plate member 6, a gasket 9 is positioned between the flanges 4, 6 before joining the flanges together and tightening the nuts 8. Preferably, the gasket 9 is a Chevron®- type gasket that is capable of maintaining a pressure-tight seal under the relatively high pressures experienced by the pressure vessel 2.

Figure 2B:
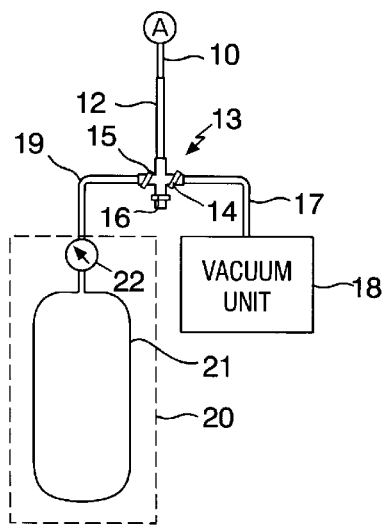
Figure 2C:
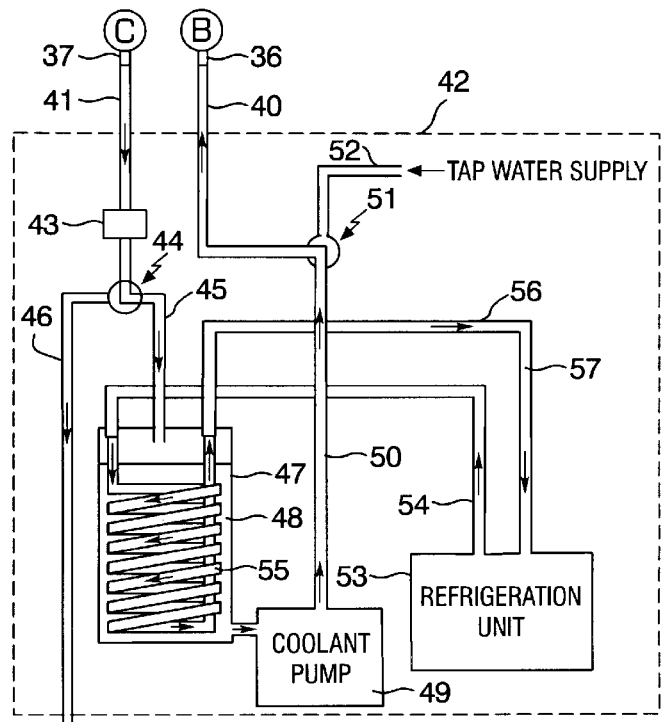

A conduit 10 extends through an aperture in the plate member 5, and has a first end that communicates with the space enclosed by the pressure vessel 2 when the vessel is assembled. Preferably, the conduit 10, like the other conduits of the apparatus 1 yet to be described, is composed of a length of a pipe made of a metal such as copper, although other types of conduits can be useful if they are sufficiently durable to withstand the relatively high temperatures and pressures existing in the vessel 2 during operation and damage by accidental contact. A fitting 11 is coupled to the conduit 10 and the plate member 5 to form a pressure-tight seal therebetween. Preferably, the fitting 11 (like the other fittings used in the apparatus that have not yet been described) is a metal compression type fitting, although other fitting types, including O-ring varieties, can be used effectively. In FIG. 2B, a second end of the conduit 10 is coupled to communicate with a first end of a hose 12 that, like other hoses used in the apparatus, is preferably composed of a high-pressure and high-temperature plastic material. Preferably, the hose 12 is secured in place with a hose clamp (not shown) or other suitable device. In the following description, for simplicity, specific reference to a hose clamp or other device used to secure a hose to another element, will be omitted. However, it should be understood that such hose clamps are preferably used at each junction of a hose with another element throughout the apparatus 1.

A second end of the hose 12 is coupled to communicate with one leg of a four-way conduit 13 that is a commercially-available device. Opposite the leg coupled to the second end of the hose 12, the four-way conduit 13 includes three valved legs. The three valved legs can each be selectively opened or closed by appropriate manipulation of one of the valves 14, 15, 16 associated with each leg. The leg with the valve 14, is coupled to communicate with a first end of a hose 17 that has a second end coupled in communication with a vacuum unit 18. The vacuum unit 18 can be a pump or other commercially-available device suitable to develop a suction to draw gas from the hose 17 when the unit 18 is activated. The leg of the four-way conduit 13 with the valve 15 is coupled to communicate with a first end of hose 19 that has a second end coupled in communication with a pressurized gas unit 20. The unit 20 supplies pressurized gas to the hose 19. Preferably, the unit 20 includes a pressurized gas tank 21. The tank 21 contains a gas of a type that is appropriate to supply the pressure needed to prevent a substance from peritecticly decomposing upon solidification so that a crystal of the substance can be grown in the apparatus 1. The pressurized gas unit 20 also preferably includes a valve 22 that can be controlled by hand or by an external electric signal, for example, depending upon the type of valve, to determine the pressure of the gas supplied by the unit 20. The four-way conduit 14 also includes a leg with a valve 16 that can be used to bleed pressurized gas from the vessel before opening the vessel 2.

The apparatus 1 also includes a cooling unit 23 (see FIG. 2A) that functions to cool an exterior portion 24 of a substance 25 from which a crystal 26 is made. The substance 25 is often referred to as a 'charge material.' The exterior portion of the charge material is cooled by the unit 23 to a temperature sufficiently low to maintain its solid phase. Thus, the exterior portion of the charge material acts as a crucible to contain a molten interior portion 27 of the charge material. Because the solid exterior portion contains the liquid interior portion of the charge material 25, the solid exterior portion of the charge material is sometimes referred to as a 'skull.' Due to the fact that the molten interior portion 27 and the solid exterior portion 24 (i.e., the skull crucible) are made of the same charge material 26, relatively few impurities are introduced into the interior portion 27 relative to crystal-growing device, that use a crucible of a different material that will react at least to some extent with the molten material contained therein. As often occurs when growing a crystal, a pocket of gas 28 may develop above the molten interior portion 27.

The cooling unit 23 preferably includes a manifold 29 having a surface 30 upon which are mounted a plurality of elongated cooling members 31, a configuration similar to the apparatus shown in FIG. 2 of U.S. Pat. No. 4,224,100 issued Sep. 23, 1980 to Robert A. Hartzell, that is incorporated herein by reference. Preferably, the members 31 are circularly arranged about a longitudinal axis of the cooling unit 23 (that is parallel to the vertical direction in FIG. 4) to define inner side cooled surfaces of an enclosure 32 that has a closed floor defined by the manifold's surface 30. The enclosure 32 thus contains the charge material 25, and cools the exterior portion of the charge material to maintain its solid phase. The manifold 29 defines input and output passages (not shown) in its interior, and the input and output passages are coupled to respective input and output conduits of the members 31. The members 31 essentially include two concentric inner and outer tubes configured so that the inner tube has an open end toward the end extremity of the member 31, and so that the outer tube has a greater length than the inner tube that is sealed at its end for containment of the coolant flowing therein. The coolant flow that is incoming to the member 31 from the input passage of the manifold 29, flows vertically upward in FIG. 1 through the inner tube, and flows downward in FIG. 1 between the inner and outer tubes, for return to the outer passages of the manifold 29, or vice versa. Preferably, the manifold 29 and the members 31 are made of a material that has a relatively high thermal conductivity and durability, such as copper or other suitable metal.

To prevent the charge material 25 from erupting outward to damage or foul elements of the apparatus 1, the members 31 can be enclosed by a protective cylinder 33, preferably made of a ceramic material, that fits in sleeve fashion over the members 31 and is held in position thereby.

The input and output passages of the manifold 29 are coupled to communicate with respective ends of conduits 34, 35. The conduits 34, 35 are flexible, and can be made of relatively thin copper tubing or the like. The ends of the conduits 34, 35 opposite the ends coupled to the manifold 29, are coupled to communicate with respective ends of conduits 36, 37 that are preferably made of relatively thick, sturdy copper tubing. The ends of the conduits 34, 35 are preferably coupled to respective ends of the conduits 36, 37 by welding or the like. The conduits 36, 37 extend through respective apertures defined in the plate member 5. Fittings 38, 39 are coupled between respective conduits 36, 37 and the plate member 5 to form pressure-tight seals between the plate member 5 and the conduits 36, 37. The ends of the conduits 36, 37 opposite the ends coupled to the conduits 34, 35, are coupled to communicate with respective first ends of hoses 40, 41 (see FIG. 2C) that have second ends coupled to receive and discharge, respectively, a flow of coolant from and to a coolant supply unit 42.

Preferably, the coolant supply unit 42 includes an orifice 43 that defines a constriction in the coolant flow path that causes pressure build-up in the hose 41, the conduits 37, 35 and hence, in the cooling unit 23. The pressurization of the coolant prevents its vaporization under the heat emanating from the charge material 25 so that the coolant can effectively transfer heat away from the cooling unit 23 to avoid damage or destruction thereof, and to ensure that the exterior portion 24 of the charge material 25 remains in the solid phase.

The orifice 43 has an end opposite that receives the coolant from the hose 41, that is coupled to communicate with a diverter 44 in the unit 42. The diverter 44 is a commercially available device that can be set manually, for example, to couple the flow from the orifice 43 to either the hose 45 or the hose 46 of the unit 42. In normal operation of the apparatus, it is preferred to set the diverter 44 to direct the flow from the orifice 43 to the hose 45. The hose 45 channels the flow of coolant received from the diverter 44 to the coolant tank 47 of the unit 42, for holding a relatively large volume of the coolant 48. Preferably, the tank 47 holds between fifty and one-hundred gallons the coolant 48. The coolant tank 47 is coupled to communicate with an input of coolant pump 49 of the unit 42, that provides the motive force to circulate the coolant 48 through the cooling unit 23. The coolant pump 49 can be one of a wide variety of commercially available pumps. The output of the pump 49 is coupled to communicate with an end of a hose 50 of the unit 42, whose opposite end is coupled to communicate with a diverter 51 of the unit 42. The diverter 51 is also coupled to communicate with an end of the hose 52 of the unit 42. The diverter 51 can be selectively controlled to receive the coolant flow from the hose 50 or to receive a coolant flow from a water tap supply via the hose 52 of the unit 42. In normal operation, the diverter 51 preferably couples the hose 50 into communication with the hose 40.

The coolant supply unit 42 also includes a refrigeration unit 53, a hose 54, a coil 55 and a hose 56 in which a coolant 57 flows. The refrigeration unit 53 is coupled to communicate with an end of the hose 54 whose opposite end is coupled to the coil 55. The coil 55 is situated inside of the tank 47, and is coiled to increase the area available for heat-transfer from the coolant 48 to the coil 55. Also preferred, the coil 55 is composed of a material with a high thermal conductivity such as copper. The coil 55 has a second end that is coupled to communicate with a the hose 56 whose opposite end is coupled to the refrigeration unit 53.

The refrigeration unit 53 serves to cool the coolant 57, and includes a pump (not shown) that provides the motive force to drive the coolant 57 through the hose 54, the coil 55 and the hose 56 for return to the unit 53. In normal operation of the coolant supply unit 42, the coolant 48 in the tank 47 is cooled by heat-transfer to the coolant 57 circulating in the coil 55. Preferably, the coolants 48, 57 are water with an additive such as automotive antifreeze (i.e., ethylene glycol), that has a relatively high vaporization temperature. However, the ethylene glycol additive should not be added in an amount greater than ten percent because it has a relatively low heat capacity.

The coolant supply unit 42 is part of a circulatory cooling system, meaning that a fixed amount of coolant is circulated continuously to cool the cooling unit 23. However, particularly in emergency situations such as failure of the coolant pump 49 or the refrigeration unit 53, a non-circulatory system can be implemented in the apparatus 1 without departing from the scope of this invention. Specifically, the diverter 51 of the coolant supply unit 42 can be switched to receive a flow of tap water from the hose 52, that is circulated through the cooling unit 23. The return flow from the cooling unit 23 can be coupled to the hose 46 by appropriately setting the diverter 44, so that the heated coolant is directed to a drain for disposal. However, a circulatory cooling system is preferred over the non-circulatory cooling system because the disposal of the significant amounts of coolant needed to cool the cooling unit 23 adds significant expense to the operational cost of the apparatus, particularly considering that, despite its comparatively rapid crystal growth rate, the apparatus 1 can require several hours of operation to produce a crystal from the charge material.

An inductive heating element 60 is situated in the pressure vessel 2 at least in operation of the apparatus and system of FIGS. 2A, 2B, 2C, 2D and 2E. The element 60 includes a coil 61 that encircles the cooling unit 23 about an axis thereof (i.e., the vertical axis in FIG. 2A). The coil 61 can be a coiled metal tube composed of copper, for example. The ends of the coil 61 are coupled electrically to conductors 62, 63, and are coupled to communicate with conduits defined by the conductors 62, 63. The conductors 62, 63 are elements included in a feedthrough 64 that functions to supply an alternating electric current to the inductive heating element 60 to heat the charge material 25, and to supply and discharge a coolant flow circulated through the coil 61 to prevent overheating of the element 60. The feedthrough 64 extends through the plate member 5 of the pressure vessel 2, and is secured to the plate member 5 by a fitting 65 that forms a pressure-tight seal between the plate member 5 and the feedthrough 64.

Figure 2D:
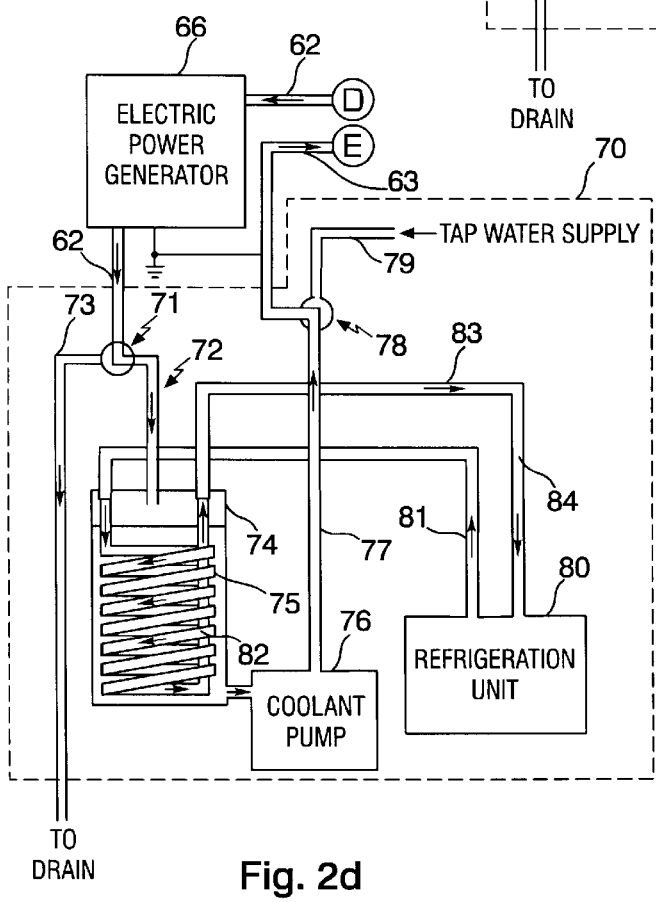
Figure 2E:
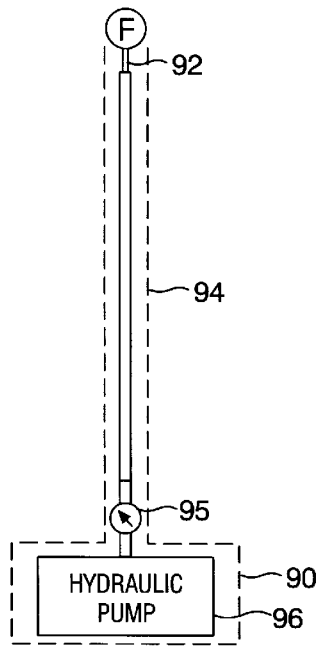

At the end of the feedthrough 64 situated outside of the pressure vessel 2, the conductors 62, 63 are electrically coupled to an electric power generator 66 (see FIG. 2D). The generator 66 can be any of a wide variety of commercially available electric power generators as will be readily understood by those of ordinary skill in this technical field. The generator 66 is commercially available by specification of a desired range of electric power frequencies appropriate to melt the particular type of material 25 from which a crystal 26 is to be made. The electric power generator 66 generates an alternating electric current, at frequencies up to the radio frequency (rf) range or even beyond, that is supplied to the inductive heating element 60. More specifically, the generator 66 generates electric power that is supplied to the conductors 62, 63 of the feedthrough 64, and to the coil 61 of the inductive heating element 60, to produce the electromagnetic field that heats the charge material 25. Preferably, the conductor 63 is electrically coupled to the ground terminal of the generator 66 as well as to the plate member 5 so that the entire pressure vessel 2 is electrically grounded. The conductor 62 is coupled to the high-voltage terminal of the generator 66. The conductor 62 is preferably insulated in the feedthrough 64 from the plate member 5 of the pressure vessel (particularly if a non-electrically insulating coolant flows in the conduits defined by the conductors 62, 63) to prevent the occurrence of a short circuit with attendant danger to a person or the apparatus itself.

In FIG. 2D, the conduit defined by the conductor 63 is coupled to receive a flow of coolant from a coolant supply unit 70 for circulation through the heating element 60. The return flow from the heating element 60 flows through the electric power generator 66 to cool components of the generator 66. From the power generator 66, the coolant flows to the coolant supply unit 70 for cooling and, in the preferred operation of the apparatus 1, recirculation through the heating element 60 and the electric power generator 66.

The coolant supply unit 70 includes a diverter 71 coupled to receive the coolant flowing from the generator 66 through the conductor 62. The diverter 71 is coupled to communicate with hoses 72, 73, and can be set to couple the conductor 62 in communication with either the hose 72 or the hose 73 of the unit 70.

In normal operation, the diverter 71 is set to couple the conductor 62 into communication with the hose 72 so that the coolant flows to a coolant tank 74 of the unit 70. The coolant tank 74 holds a relatively large supply of the coolant 75, and preferably has a capacity of fifty to one-hundred gallons. The tank 74 is coupled in communication with an input of the coolant pump 76 of the unit 70, that provides the motive force to drive the coolant 75 through the electric power generator 66 and the heating element 60. The pump 76 can be one of a wide variety of commercially-available pumps. An output of the coolant pump 76 communicates with an end of the hose 77 of the unit 70, whose opposite end is coupled to communicate with one input to a diverter 78 of the unit 70. The diverter 78 has another input coupled to communicate with an end of a hose 79 of the unit 70, whose opposite end is coupled to a tap water supply. In normal operation, the diverter 78 is set to couple the hose 77 to the conductor 63 so that the coolant flows from the coolant pump 76, through the heating element 60, through the generator 66 and back to the coolant supply unit 70 for recirculation.

To cool the coolant 75, the coolant supply unit 70 preferably includes a refrigeration unit 80, a hose 81, a coil 82 and a hose 83. The refrigeration unit 80 is coupled to communicate with a first end of the hose 81 whose opposite end is coupled to communicate with an end of the coil 82. The opposite end of the coil 82 is coupled to communicate with an end of the hose 83 that has an opposite end coupled to communicate with the unit 80. The refrigeration unit 80 can be one of a wide variety of commercially-available devices, and serves to cool a coolant 84. The unit 80 includes a pump (not shown) that drives the refrigerated coolant 84 through the hose 81 to the coil 82. The coil 82 is situated in the tank 74 and spirals in the coolant 75 to increase the area available for heat transfer from the coolant 75, to the coolant 84 flowing in the coil 82. Preferably, the coil 82 is composed of a material such as copper, that has a high thermal conductivity. The coolant 84 with an elevated temperature due to heat transfer from the coolant 75, flows to the hose 83 for return to the refrigeration unit 80 for recooling. Preferably, the coolant 84, like the coolant 75, is a liquid substance such as water with an additive, for example, ethylene glycol, to increase the vaporization temperature of the substance. The ethylene glycol additive is preferably restricted in amount to about ten percent or less because it has a relatively low heat capacity.

The coolant supply unit 70 is normally a circulatory coolant system. However, particularly in emergency situations, the coolant supply unit 70 can be converted into a non-circulatory system by switching the diverter 78 to receive the tap water flow from hose 79, and by switching the diverter 71 to direct the tap water coolant to the drain for disposal. Thus, in the event of a malfunction such as a coolant pump or refrigeration unit failure, the coolant supply unit 70 can rapidly be changed to a configuration that uses tap water to cool the electric power generator 66 and the heating element 60. In general, this non-circulatory system is not preferred because, over the several hours typically necessary to complete a crystal-growing operation, the amount of tap water used can be a significant source of expense in operating the apparatus. Nonetheless, the non-circulatory system is an option that can be used with the apparatus 1 of this invention.

In FIG. 2A, to focus the energy emitted by the inductive heating element 60, a shield 85 in accordance with this invention, is preferably used. The shield 85 is composed of a metal cylinder made of copper or other high electrical conductivity material, and is situated in the pressure vessel 2 to surround at least the coil 61 of the heating element 60. The shield 85 also serves to reduce heating of the wall of the chamber member 3 that is situated in proximity to the heating element 60, a feature of this invention that prevents thermal weakening of the chamber member's wall with the attendant danger of explosion by sudden release of the pressurized gas due to rupture of the wall. To support the shield 85 in position relative to the inductive heating element 60, the shield 85 can be seated on a shield support member 86 that rests on the plate member 5. The support member 86 can be a cylindrical section of plastic pipe, for example, such as a polyvinyl chloride or other commercially-available plastic pipe. Alternatively, brackets 87 mounted between the wall of the chamber member 3 and the shield 85, can be used to support the shield 85 in the appropriate position to surround the heating element 60. Preferably, a conductor 88 such as a length of copper wire, is electrically coupled between the shield 85 and the conductor 88 to electrically ground the shield 85. Preferably, an end of the conductor 88 is attached by welding to the shield 85, and its opposite end is welded or wrapped several times about the conductor 63 where it comprises the outer surface of the feedthrough 64.

It is believed that the beneficial behavior of the shield 85 is due to its reflection of the rf radiation from the heating element 60. Accordingly, to maximize its beneficial radiation-focusing effects, the shield 85 is preferred for use with the heating element 60 operating at radiation frequencies (rf, for example) at which the shield 85 is reflective to the radiation.

To increase the size of the crystal 26 produced with the apparatus 1, it is desirable to move the heating element 60 relative to the cooling unit 23. When so moved, a limited area in which the charge material 25 is sufficiently heated to form the molten interior portion 27, moves along the axis (specifically, the vertical axis in FIG. 2A) of the charge material 25 to progressively heat and liquefy the charge material 25 to produce the molten interior portion 27. As the limited area heated by the heating element 60 moves along the axis, the previously molten portion of the charge material 25 crystallizes. The resulting crystal 26 is elongated along the vertical axis in FIG. 2A.

To affect the movement of the heating element 60 relative to the cooling unit 23, an actuator 90 in accordance with this invention, is used. The actuator 90 includes a hydraulic device 91 that is coupled between the cooling unit 23 and the plate member 5. The hydraulic device 91 can be selectively extended or retracted by supplying or extracting hydraulic fluid from the hydraulic device 91. For example, the device 91 can be one of several commercially-available devices including a device that has a cylinder and a piston that moves in the cylinder based on the flow of hydraulic fluid to or from the device. The actuator 90 includes a conduit 92 that has a first end coupled to supply or extract hydraulic fluid from the device 91. The conduit 92 is secured to the plate member 5 with a fitting 93 of the actuator 90, that forms a pressure-tight seal between the conduit 92 and the plate member 5. As so fixed by the fitting 93, the conduit 92 extends through the plate member 5, and has a second end situated outside of the pressure vessel 2. To the second end of the conduit 92 (see FIG. 2E), a first end of a hose 94 of the actuator 90, is coupled in communication. The actuator 90 also includes a valve 95. The second end of the hose 94 is coupled to a first end of the valve 95 that can be controlled by hand or electronically to maintain a constant flow rate from the hydraulic device 91. A second end of the valve 95 is coupled to communicate with the hydraulic pump 96, that can be hand- or electronically-actuated to drive hydraulic fluid contained in a reservoir within the pump 96, into the hydraulic device 91 via the valve 95, hose 94, and conduit 92.

Figure 3:
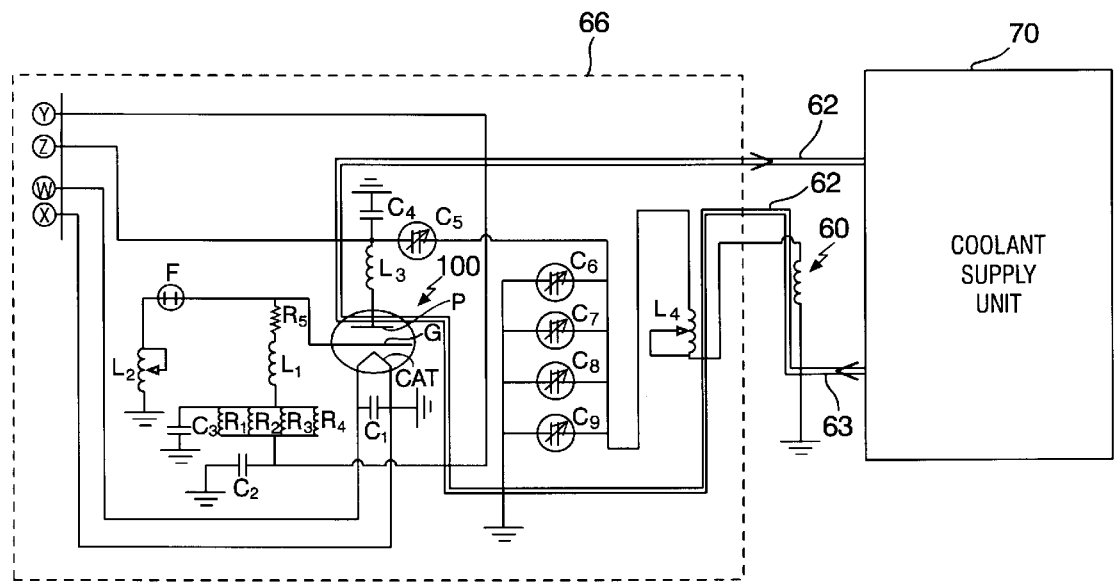
FIG. 3 is a relatively detailed view of an electric power generator for use with the apparatus and system of this invention.

FIG. 3 is a diagram of an electric power generator 66 preferred for use in the apparatus 1 of this invention. The generator 66 is electrically coupled to the conductor 62, and also has certain components defined by or situated in contact with the conductor 62, that are cooled by circulation of the coolant through the generator 66. The generator 66 includes an oscillator tube 100 that has a cathode terminal CAT, a grid terminal G and a plate terminal P. The cathode terminal CAT is coupled to receive an a.c. voltage from terminals W and X. The a.c. voltage received at terminals W and X heats the cathode terminal CAT to generate free electrons. The capacitor C1, coupled between the terminal W and ground, stabilizes the a.c. voltage applied to the cathode terminal CAT. A terminal Y receives an a.c. signal used to generate oscillations in the generator 66. More specifically, the capacitors C1, C2, the inductors L1, L2 and the resistors R1–R5 generate oscillations based on the a.c. signal at the terminal Y, that are applied to the grid terminal G of the oscillator tube 100. The capacitor C2 has a first end coupled to the terminal Y, and a second end coupled to ground. To the terminal Y, the first ends of the resistors R1–R4 are coupled. The second ends of the resistors R1–R4 are coupled to a capacitor C3 whose opposite end is coupled to ground. The second ends of the resistors R1–R4 are coupled to a first end of the series combination of the inductor LI and the resistor R5, that have a second end coupled to the grid terminal G and a first end of a fuse F. The opposite end of the fuse F is coupled to the inductor L2 whose opposite end is coupled to ground. The inductor L2 is variable to adjust the oscillation frequency of the voltage applied to the grid terminal G. To urge the electrons from the cathode terminal CAT to the plate terminal P, a relatively large d.c. voltage can be applied to terminal Z of the generator 66. The flow of electrons from the cathode terminal CAT to the plate terminal P depends on the oscillating signal at the grid terminal G. The plate terminal P thus generates a powerful a.c. signal that is an amplified version of the a.c. signal at the grid terminal G. To prevent the plate terminal P from overheating, the coolant from the conductor 62 is supplied to the plate terminal P. The plate terminal P is electrically coupled to an inductor L3 whose opposite end is coupled to receive the d.c. voltage from the terminal Z. A capacitor C4 is coupled between the terminal Z and ground to stabilize the d.c. voltage applied to the plate terminal P. A capacitor C5 has a first end coupled to the terminal Z, and a second end coupled to the first ends of the parallel capacitors C6–C9 whose opposite ends are coupled to ground. The second end of the capacitor C5 is also coupled to a first end of the inductor L4 whose opposite end is coupled to the heating element 60. The capacitors C5–C9 and the inductor L4 are variable to allow matching of the impedance of the generator 66 with the impedance associated with the heating element 60 that can vary depending upon the amount of the charge material 25 in the enclosure 32 of the cooling unit 23. The inductor L4 defined by the conductor 62 receives the coolant flow from the coolant supply unit 70 to ensure that the inductor L4 will not overheat. Although the above-described generator 66 is preferred for use with the apparatus 1 of this invention, it is presented by way of example, and not limitation, as many different generators can be used with the apparatus of this invention as will be readily understood by those of ordinary skill in this field.

Figure 4:
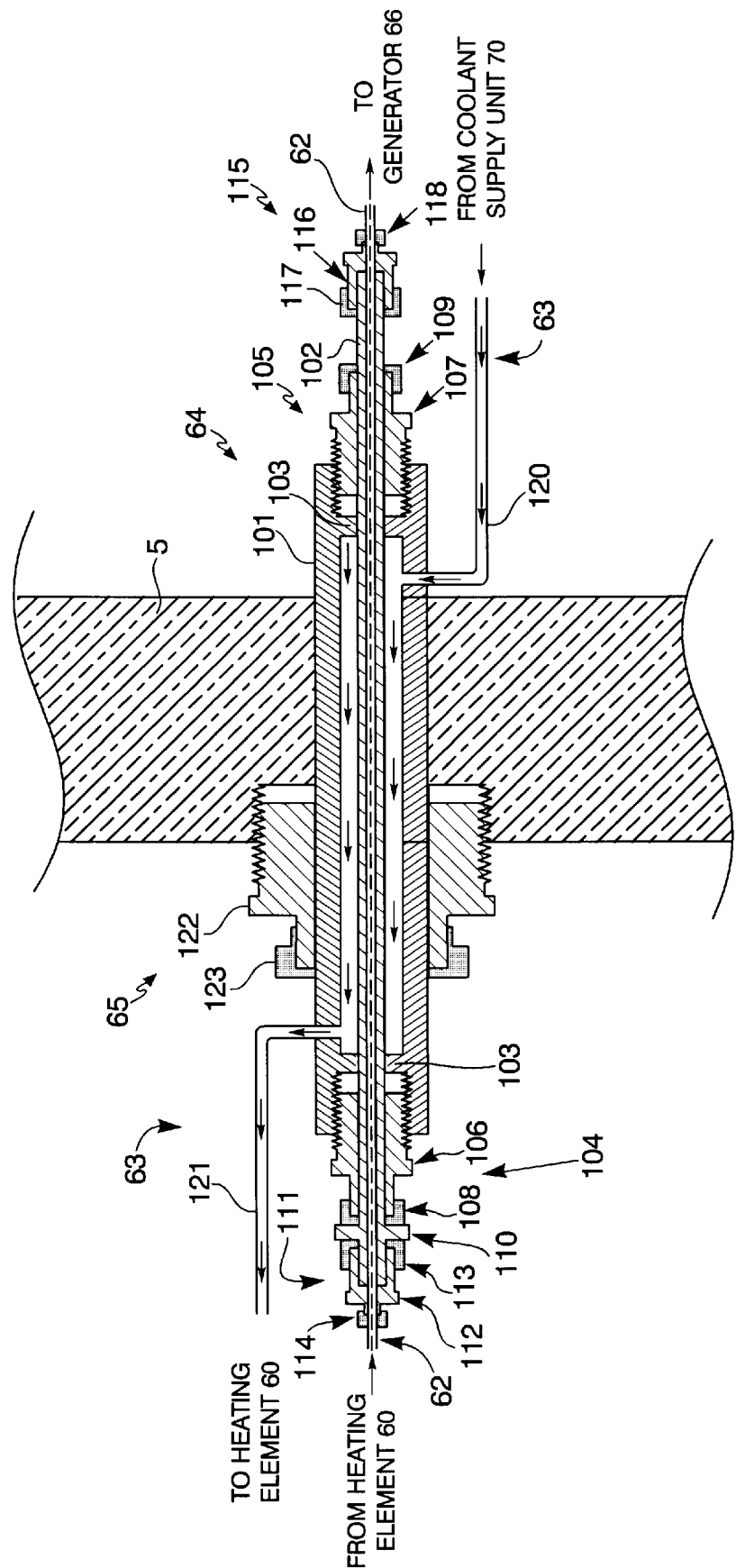
FIG. 4 is a cross-sectional view of a feedthrough in accordance with this invention.

FIG. 4 is a relatively detailed cross-sectional view of a preferred embodiment of the feedthrough 64 in accordance with this invention. The conductor 62 is situated at the core with the feedthrough 64, and is enclosed by a relatively large-diameter portion 101 of the conductor 63. Preferably, the portion 101 is cylindrical in shape, composed of an elongated metal tube made of copper, for example, to establish good electrical contact between the outer surface of the portion 101 and an inner surface of the plate member 5 that defines the aperture through which the feedthrough 64 extends. For durability, the metal tube composing the portion 101 is preferably relatively thick, for example, about one-half inch thick in radial thickness.

If the coolant flowing in the feedthrough 64 is not electrically insulative, electrical insulation should be provided between the conductors 62, 63. To provide electrical insulation between the conductors 62, 63, an electrical insulator 102, preferably with an elongated tube shape, receives the conductor 62 in its hollow interior. The insulator 102 can be composed of an electrically-insulative plastic or ceramic material that is electrically-insulative. Preferably, the portion 101 defines constrictions 103 at its two ends. The constrictions 103 are sized so that the insulator 102 securely fits in and is supported by the portion 101. To seal the ends of the portion 101, fittings 104, 105 are disposed at respective ends of the portion 101. The fittings 104, 105 have respective members 106, 107 with centrally defined apertures, to allow passage of the insulator 102. The members 106, 107 have respective relatively large-diameter threaded ends that are screwed into corresponding threads defined inside of the ends of the portion 101. The members 106, 107, when screwed into the respective ends of the portion 101, form pressure-tight seals used to contain the coolant flowing in the feedthrough 64. The opposite, relatively small-diameter threaded ends of the members 106, 107 receive respective apertured caps 108, 109 through the open centers of which extend the insulator 102. The caps 108, 109 are threaded onto respective ends of the members 106, 107 to cause the members 106, 107 to constrict or compress down upon the insulator 102, to fix the insulator 102 in position relative to the portion 101. The insulator 102 has a collar 110 with a relatively large diameter compared to the other portions of the insulator 102. The collar 110 abuts the cap 108 to prevent the insulator from sliding toward the right in FIG. 4 relative to the portion 101. A fitting 111 is disposed in contact with the end of the insulator 102, that is situated inside of the vessel 2 during operation of the apparatus 1. The fitting 111 includes a member 112 with relatively large-and small-diameter threaded ends. The large-diameter end of the fitting 111 defines a cylindrical recess at one end to receive the end of the insulator 102. A cap 113 with a central aperture through which the insulator 102 extends, is disposed between the collar 110 and the member 112, and is screwed into engagement with the large-diameter end of the member 112 to compress the member 112 to grip the insulator 102. The member 112 defines a central aperture that communicates with the cylindrical recess of the member 112, and through which extends the conductor 62. The central aperture is also defined through the small-diameter threaded end of the member 112. To the member 112, a cap 114 is threaded to compress the member 112 into contact with the outside of the conductor 62 to fix its position with respect to the insulator 102. The cap 114 defines a central aperture through which extends the conductor 62. With the fitting 111 fixed in position relative to the conductor 62, the cap 113 abuts the collar 110 from the side opposite the cap 108, so that the collar 110 prevents the insulator 102 from sliding in the portion 101 either to the right or left in FIG. 4.

On the extreme right of the feedthrough 64 in FIG. 4, a fitting 115 functions to fix the conductor 62 in position relative to the insulator 102. The fitting 115 is similar to the fitting 111, and includes a member 116 that defines a cylindrical recess proportioned to snugly receive the end of the insulator 102. A cap 117 of the fitting 115, has an aperture through which the insulator 102 extends. When screwed onto the relatively large-diameter threaded end of the member 116, the cap 117 compresses the member 116 to engage with and grip the end of the insulator 102. At the opposite end of the member 116, a small-diameter threaded end is disposed. The conductor 62 passes through a central aperture defined in the member 116, that communicates with the cylindrical recess. A cap 118 with a central aperture through which the conductor 62 passes, is screwed onto the small-diameter threaded end of the member 116 to cause it to grip and hold the conductor 62 in position relative to the insulator 102.

To channel coolant into the hollow interior of the portion 101 between the inside wall of the portion 101 and the outside wall of the insulator 102, an arm 120 of the conductor 63, preferably a bent copper tube, has an end that is coupled by welding, for example, to communicate with the hollow interior of the portion 101 at a position that is outside of the pressure vessel 2 when assembled. On the left side of FIG. 4, an arm 121 of the conductor 63, preferably also formed of a bent copper tube, is mounted by welding, for example, to communicate with the hollow interior of the portion 101, and serves to couple the electric power and coolant flow to the heating element 60. In the preferred embodiment, the fitting 65 serves to fix the feedthrough 64 relative to the plate member 5. The fitting 65 includes a member 122 with a relatively large diameter end that is threaded into corresponding threads of the plate member 5. An apertured cap 123 through the open center of which passes the portion 101, is screwed onto a relatively small-diameter end of the member 122 to compress the member 122 into contact with the portion 101. The fitting 65 also forms a pressure-tight seal between the plate member 5 and the feedthrough 64. Preferably, the other fittings 11, 38, 39, 93 of the apparatus 1 are similar in configuration to the fitting 65.

In operation, if the pressure vessel 2 is not already opened, the bolts 7 and nuts 8 are loosened and removed from the flanges 4, 6 of the chamber member 2 and the plate member 5, respectively, and the chamber member 2 and the plate member 5 are separated. The chamber member 2 and the plate member 5, made of the preferred thick steel material, can be extremely heavy so that a steel frame with one or more hydraulic pistons (not shown) can be used to selectively separate or join the chamber member 3 and the plate member 5. The frame preferably bounds the space in which the pressure vessel 2 is situated, and supports one end of the hydraulic piston(s) while the other end of the piston(s) is coupled to either the chamber member 3 or the plate member 5, to lift or lower one member 3, 5 relative to the other member.

The charge material 25, preferably in powdered form, is inserted into the enclosure 32 defined in the cooling unit 23. With some kinds of charge materials 25, susceptor materials are used to raise the temperature of the charge material 25 to a temperature sufficiently high that it becomes electrically conductive and thus susceptible to the electromagnetic field generated by the heating element 60. For example, for silicon carbide (SiC) or yttrium barium cupric oxide ($YBa_2Cu_3O_x$), pieces of graphite can be inserted into the charge material 25 for use as the susceptor material. For aluminum nitride (AlN) or aluminum gallium nitride ($AlGaN_x$), pieces of aluminum can be inserted into the charge material for use as the susceptor. Also, for aluminum gallium nitride ($AlGaN_x$) and for gallium nitride (GaN), gallium can be used as the susceptor material. Other material such as tungsten can be used as susceptor material for suitable types of substances for use in making a crystal from such substances. With some types of charge material, beneficial results are obtained by pre-pressing the charge material to obtain a compacted mass situated in the enclosure 32 of the cooling unit 23. After situating the charge material 25 and inserting the appropriate susceptor material, if used, in the enclosure 32, the pressure vessel 2 is enclosed by joining the flange 4 of the chamber member 3 to the flange 6 of the plate member 5 with the gasket 9 situated therebetween to form a pressure-tight seal, and by securing the flanges 4, 6 with the bolts 7 and the nuts 8.

The valves 15, 16 of the four-way conduit 13, are closed, and the vacuum unit 18 is activated. The valve 14 of the four-way conduit 13, is opened so that the vacuum unit 18 draws out the atmospheric gases in the space enclosed by the pressure vessel 2. After the pressure vessel 2 is sufficiently evacuated, the valve 14 is closed and the vacuum unit 16 can be deactivated if desired.

In the pressurized gas unit 20, a pressurized gas tank. 21 with the appropriate type of gas to supply the necessary pressure to prevent the peritectic charge material 25 from decomposing, is coupled to the valve 22. The selection of the gas type used to supply the pressure to prevent peritectic decomposition is generally determined by the compound or element of the charge material 25 that tends to volatize first after the material melts. For example, for yttrium barium cupric oxide ($YBa_2Cu_3O_x$), oxygen can be used to supply the pressure to prevent peritectic decomposition of the charge material 25. For aluminum nitride (AlN), gallium nitride (GaN) and aluminum gallium nitride ($AlGaN_x$) charge materials, nitrogen is an appropriate gas for supplying the pressure to prevent decomposition. However, for some charge materials, gases unrelated to the charge material composition can be used. For example, for silicon carbide (SiC), nitrogen can be used to supply the pressure needed to render the silicon carbide congruently-melting to prevent its peritectic decomposition. Also, for AlN, GaN and $AlGaN_x$, an inert gas can be used to supply the pressure need to prevent decomposition. Further, for reducing environments, hydrogen or a hydrogen-inert gas mixture can be used to supply the pressure needed to prevent peritectic decomposition.

The valve 22 is set to a pressure value appropriate to maintain a desired pressure for the substance composing the charge material 25, to prevent peritectic decomposition. In general, the pressure value needed to prevent peritectic decomposition of the material 25 does not need to be determined with exactitude. Instead, the pressure value can be set to an arbitrarily high value well above the congruent melting pressure required to prevent peritectic decomposition. Alternatively, the pressure value can be determined without undue experimentation for a particular substance by growing a crystal 26 under a noted pressure value, and determining whether the crystal 26 is stoichiometric by comparing the physical characteristics (for example, conductivity, resistivity, band gap, etc.) of the crystal produced from the charge material 25, with known values of such properties for stoichiometric crystals, and using any difference between the determined and known values of the physical characteristics as a basis to adjust the pressure for a subsequent iteration of growing a crystal with the apparatus 1. Through successive iterations, at least an approximate value for the gas pressure needed to prevent peritectic behavior of a particular charge material can be determined with reasonable precision. In general, it is preferred to operate at a level sufficiently high above the congruent melting pressure for a given temperature to ensure that peritectic behavior will not occur, and yet sufficiently low that significant unnecessary reinforcing material is not required to be added to the pressure vessel.

With the valve 22 set to the appropriate value to provide the necessary pressure to prevent the charge material from decomposing, the valve 15 is opened to release as contained in the tank 21. The released gas flows through the valve 22, hose 19, four-way conduit 13, hose 12 and conduit 10 to enter the vessel 2 to pressurize the charge material 25 contained in the cooling unit 23 to prevent its decomposition.

To prepare for the crystal-growth mode of operation of the apparatus, the actuator 90 is activated to move the cooling unit 23 to a first, elevated position in FIG. 1, relative to the heating element 60. This action is accomplished by activating the hydraulic pump 96, either by hand or by an electronic control signal, to force hydraulic fluid through valve 95, hose 94, conduit 92 and into hydraulic device 91 to cause the hydraulic device 91 to extend.

The coolant pump 49 of the coolant supply unit 42 is activated to circulate the coolant through the cooling unit 23. Specifically, the coolant pump 49 drives coolant through the hose 50, the diverter 51, the hose 40, the conduit 36, the flexible conduit 34, the input passages defined inside of the manifold 29, where the flow is divided through the individual elongated members 31, that return the coolant flow to the output passages of the manifold 29. The surfaces of the enclosure 32 defined by the cooling unit 23 are thus cooled. The coolant flow is forced from the output passages of the manifold 29 through the flexible conduit 35, the conduit 37, and the hose 41, to return to the coolant supply unit 42. The orifice 43 builds pressure behind it so that the coolant will not vaporize in the cooling unit 23 under the severe temperatures generated by the heating element 60. From the orifice 43, the coolant travels to the diverter 44 that couples the flow to the hose 45 for supply to the tank 47. The refrigeration unit 53 is activated to cool and drive the coolant 57 through the hose 54, the coil 55, and the hose 56 for return to the unit 53. The coolant 57 flowing in the coil 55 transfers heat away from the coolant 48. The coolant 48 is thus cooled and flows to the coolant pump 49 for recirculation.

In the coolant supply unit 70, the coolant pump 76 is activated to force the circulation of coolant 75 through the feedthrough 64, the heating element 60 and the electric power generator 66. More specifically, the coolant pump 76 forces the coolant 75 through the hose 77, the diverter 78 and into the conduit defined by the conductor 63. The coolant 75 further flows through the feedthrough 64, through the heating element 60 and into the conduit defined by the conductor 62. The conduit defined by the conductor 62 passes through the inductor L4 and in proximity to the plate terminal P of the generator's oscillator tube 100, to cool the inductor L4 and the plate terminal P. The pump 76 further forces the coolant 75 to return to the coolant supply unit 70 via the conduit defined by the conductor 62. In the coolant supply unit 70, the coolant 75 flows through the diverter 71, the hose 72 and into the tank 74. The refrigeration unit 80 is activated to cool and circulate the coolant 84 through the hose 81, the coil 82 and back to the unit 80 via the hose 83. The coolant 84 acts to carry heat away from the coolant 75. The coolant 75, thus reduced in temperature, returns to the coolant pump 76 for recirculation.

The electric power generator 66 is activated to generate a high-power electromagnetic field through induction in the coil 61 via conductors 62, 63. Particularly at rf frequencies, the shield 85 significantly helps to focus the energy emitted radially outward from the coil 61 back to the charge material 25 for use in heating the charge material. The shield 85 thus provides a significant reduction in the amount of power required by the apparatus 1 during operation. The susceptor material, if used, will heat and in turn cause the charge material 25 to heat significantly, attaining temperatures as high as 2000–4000 Celsius. At these high temperatures, the charge material 25, even if not particularly electrically conductive at room temperature, becomes sufficiently conductive to be further heated by the coil 61. However, the cooling action of the cooled surfaces of the enclosure 32 defined in the cooling unit 23, prevents the exterior portion 24 of the charge material 25 from melting. The cooling action of the surface 30 and the members 31 is not sufficiently great to prevent the interior portion 27 of the charge material 25 from becoming molten in the limited area encircled by the coil 61. The exterior portion 24 thus acts as a skull crucible that contains the molten interior portion 27 of the charge material 25.

Once the interior portion 27 of the charge material becomes molten to a sufficient extent, the valve 95 of the actuator 90 is set to an appropriate hydraulic fluid flow rate that is proportional to the desired rate of crystal growth, and the hydraulic pump 96 is deactivated to allow fluid to flow out of the hydraulic device 91, the conduit 92, the hose 94, the valve 95 to the reservoir of the hydraulic pump 96, thus initiating the crystal-growth mode of operation. The weight of the cooling unit 23 and the charge material 25 is sufficient to force the hydraulic fluid into the hydraulic pump's reservoir, so that the cooling unit moves in the downward vertical direction in FIG. 1, relative to the heating element 60. Preferably, the setting of the valve 95 allows the most rapid relative movement possible between the cooling unit 23 and the heating element 60, without incurring the risk of producing a defective crystal due, for example, to formation of a non-flat growth face by moving too rapidly. Typically, growth rates of 5 to 30 millimeters per hour are possible with the apparatus 1 without incurring an unreasonable risk of producing defects in the crystal grown. As the hydraulic fluid returns to the hydraulic pump 96, the limited area of charge material that is heated in the center of the coil 61, moves up the axis (the vertical axis in FIG. 1) of the charge material 25. As the liquid interior portion 27 thus advances along the vertical axis in FIG. 1 with the limited area heated by the coil 61, the molten portion of the charge material solidifies in a portion of the charge material body previously heated by the coil 61, thus producing an elongated crystal. Because the molten portion 27 of the charge material is subjected to gas pressure in the vessel 2, decomposition by peritectic reaction is prevented so that the crystal is stoichiometric with few dislocations or lattice defects.

Once the hydraulic device 91 moves to a second position corresponding to a retracted state of the device 91, the electric power generator 66 is deactivated and the charge material 25 and apparatus 1, are allowed to cool. When the apparatus 1 and the charge material 25 are sufficiently cooled, the coolant supply units 42, 70 are deactivated and the valve 15 is closed to stop the gas flow from the pressurized gas unit 20. The valve 16 of the four-way conduit 13 is opened to bleed the pressurized gas from the vessel 2. When the pressurized gas is sufficiently bled from the vessel 2, the bolts 7 and the nuts 8 are loosened and removed from the flanges 4, 6. The chamber 3 and the plate member 5 are separated by activating the hydraulic means attached to the supporting frame. Once the pressure vessel 2 is sufficiently opened, the crystal 26 can be extracted from the enclosure 32 of the cooling unit 23 and through the open end of the cooling unit 23. The crystal can then be cut and polished to a desired size or shape. Depending on crystal type, the crystal can further be cut into wafers or the like used for the manufacture of electronic or optical devices, or fashioned into a shape appropriate for superconductive materials.

A system in accordance with this invention includes the apparatus 1 as described above, and in addition, includes the charge material 25 from which the crystals are grown from the liquid phase. The apparatus 1 and the charge material 25 are used as described above.

The apparatus and system of this invention provide several advantages relative to conventional crystal-growing devices. With the apparatus and system of this invention, a crystal of a substance that undergoes a peritectic reaction at atmospheric pressure can be grown from the liquid phase due to the pressurization of an appropriate gas contained in the pressure vessel, that prevents the substance from peritecticly decomposing. Therefore, through pressurization, stoichiometry of the molten charge material is carefully maintained so that the crystal grown with the apparatus has relatively few crystalline lattice defects, and is thus suitable for a wide band gap semiconductor or other uses in the electronics or optics industry, for example. Additionally, because the crystal is grown from the liquid phase, the growth of the crystal can be performed relatively rapidly compared to conventional crystal-growing devices. Because of the high power consumption needed to melt the charge material for crystal growth, the speed at which the crystal can be grown affects energy costs as well as crystal production rates. The apparatus and system of this invention thus make possible high crystal production rates at reduced energy consumption and associated expense. Also, because the molten interior of the charge material is composed of the same substance as the cooled exterior skull portion of the charge material, relatively few impurities are introduced into the crystal grown with the apparatus and system of this invention. Further, the energy-focusing capability of the shield helps to prevent heating of the external surfaces of the vessel, while reducing power consumption by focusing the energy emitted by the heating element to the charge material. The feedthrough also achieves increased energy efficiency relative to conventional crystal-growing devices through the coaxial arrangement of its conductors, that are coupled to supply electric current to the heating element. Also, because the feedthrough defines two conduits for channeling a coolant flow to and from the heating element, the feedthrough is cooled effectively so that the external surfaces of the pressure vessel in the vicinity of the feedthrough, are not heated to temperatures that would damage the feedthrough or plate member, a situation that could otherwise cause the pressurized vessel to explode by sudden release of the pressurized gas contained therein. Further, the cooling unit and shield reduce heating of the wall of the vessel 2 so that the vessel wall does not become weakened and present the danger of rupture and explosion under the pressure exerted by the gas contained in the vessel.

A first method in accordance with this invention includes steps of containing a molten liquid portion of a charge material, in a skull composed of a solid portion of the charge material, and a step of pressurizing at least the molten liquid portion of the charge material with a gas during the containing step. Preferably, the method also includes a step of cooling the molten liquid portion of the charge material to solidify the charge material to form a crystal, during the performance of the pressurizing step. Advantageously, through the use of the pressurizing step, a substance that undergoes a peritectic reaction at atmospheric pressure can be prevented from decomposing during crystal growth so that a crystal with proper stoichiometry, and hence relatively few crystalline lattice defects, can be grown from the substance from its liquid phase. Also, because the containing step uses a solid skull crucible for containment of the molten charge material of the same substance as the charge material, relatively few impurities are introduced to the crystal from the skull crucible. Also, by performing the preferred cooling step together with the pressurizing step, peritectic decomposition of a charge material is prevented during cooling. Accordingly, the molten charge material cools to a solid crystalline form with few lattice defects.

A second method in accordance with this invention includes a step of heating an interior portion of a charge material body to melt the interior portion. The second method also includes a step of cooling an exterior portion of the charge material body so that the exterior portion is in a solid phase and contains the molten interior portion, during the performance of the heating step. The second method further includes a step of pressurizing the charge material body with a gas during performance of the heating and cooling steps. Preferably, the second method also includes a step of cooling the molten interior portion of the charge material body to form a solid-phase crystal of the charge material. Also preferred, the heating step can be performed in a limited area along an axis of the charge material body, and the second method can include a step of moving the heat source in a direction along the axis of the material body so that a step of cooling of the interior portion of the charge material body occurs in a portion of the body that was previously heated by the heat source as the heat source progresses along the axis of the charge material body. Preferably, the second method also includes a step of shielding an inductive element used to heat the charge material, to focus the heating in the interior portion of the charge material body.

Advantageously, the heating of the interior portion of the charge material body while cooling the exterior portion of the body, provides a liquid phase molten interior portion that is contained by a cooler, solid phase exterior portion of the same charge material. Thus, the exterior portion of the charge material is not a significant source for the introduction of impurities into the molten interior portion of the charge material body. The pressurizing step prevents the interior portion of the charge material from decomposing in a peritectic reaction upon melting so that the second method can be used to manufacture crystals of substances that undergo peritectic reactions at atmospheric pressure. Further, the step of moving the heat source along the axis of the charge material body allows an elongated crystal to be formed so that relatively large crystals can be produced by the second method. In addition, the shielding of the heating element achieves focusing of the heating step toward the interior of the charge material for more efficient use of the energy consumed in the heating step.

Several modifications of the apparatus, system and methods of this invention are possible without departing from the scope of the invention. For example, the conduit 10, the hoses 12, 17, 19, and the four-way conduit 13 with valves 14, 15, 16, could be replaced with one integrally-formed four-way conduit, hose or the like, as long as the terminal end of the conduit situated inside of the vessel 2 is sufficiently durable to withstand the elevated temperature and pressure in vessel 2. Similarly, with respect to the actuator 90, the conduit 92 and hose 94 could be implemented as one integral conduit, hose or the like without departing from the scope of this invention. Likewise, if desired, the conduit 36 and the hose 40, and the conduit 37 and the hose 41, can be implemented as respective integral conduits, hoses or the like. As an alternative configuration for the feedthrough 64, if the portion 101 is sufficiently thick to withstand the pressure produced in the pressure vessel 2, the constrictions 103 can be omitted so that the portion 101 be machined more readily, for example, by boring out a solid cylinder. Alternatively, the constriction 103 on the right side of FIG. 4 can be omitted to allow the portion 101 to be readily machined, and the constriction 103 on the left side of FIG. 4 can be left in place to add reinforcement of the feedthrough 64 at the portion thereof that is situated inside of the pressure vessel 2 during operation of the apparatus, and thus, which is subjected to the high pressure produced in the vessel 2. Also, a thermal shield 125 such as a plate of ceramic material, could be mounted to the inside wall of the chamber member 3 with brackets 126 or the like so that, upon joining the chamber member 3 to the plate member 5, the thermal shield 125 is disposed above the heating element 60, the cooling unit 23 and the charge material 25 contained therein. The effect of the thermal shield 125 is to reduce the amount of heat propagating from the charge material 25 upward in the vertical direction in FIG. 2A, so that the vertical dimension of the chamber member 3 can be reduced without posing a danger of rupture of the upper domed wall of the chamber member 3 in FIG. 2A due to thermal weakening. The reduction in the chamber member's dimension made possible with the thermal shield 125 can provide a savings in the amount of material required to manufacture the chamber member 3. Further, although in the disclosed embodiment of the apparatus of this invention, the actuator 90 moves the cooling unit 23 relative to the heating element 60 that is stationarily fixed to the member 5, with some modification, it is conceivable to use the actuator 90 to drive the heating element 60 relative to the cooling unit 23 that is modified to be fixed in a stationary position by attachment to the member 5, for example, relative to the heating element 60. In this modification of the apparatus, respective sections of the conductors 62, 63 between the feedthrough 64 and the heating element 60, are made of a flexible conductive tubing. Rather than being attached to the manifold 29, the upper end of the actuator 90 is attached to the heating element 60, and operates in a similar manner to the embodiment in which the cooling unit 23 is moved relative to the stationary heating element 60. In this modification of the apparatus, the conduits 34, 35 would no longer need to be flexible as the cooling unit 23 should be stationary by mounting to a platform or the like supported by the plate member 5.

The many features and advantages of the present invention are apparent from the detailed specification and thus, it is intended by the appended claims to cover all such features and advantages of the described apparatus, system and methods which follow in the true spirit and scope of the invention. Further, since numerous modifications and changes will readily occur to those of ordinary skill in the art, it is not desired to limit the invention to the exact construction and operation illustrated and described. Accordingly, all suitable modifications and equivalents may be resorted to as falling within the spirit and scope of the invention.

We claim:

1. An apparatus for growing a crystal from a charge material, the apparatus comprising:

a pressure vessel for containing a pressurized gas;

a cooling unit for situation in the pressure vessel, having cooled surfaces defining an enclosure to receive the charge material, the enclosure being partially opened to expose the charge material to pressure exerted by the gas contained in the pressure vessel;

an induction heating element for situation in the pressure vessels for heating an interior portion of the charge material to form a melt zone that is contained by a relatively cool, exterior portion of the charge material that is closer relative to the melt zone, to the cooled surfaces of the cooling unit; and a shield situated in the pressure vessel in operation of the apparatus, and arranged between the induction heating element and a wall of the pressure vessel, the shield preventing radio-frequency (rf) radiation generated by the induction heating element from significantly heating the pressure vessel's wall.

2. An apparatus as claimed in claim 1, further comprising:

a pressurized gas unit coupled to communicate with a space enclosed by the pressure vessel, for supplying the pressurized gas to the pressure vessel.

3. An apparatus as claimed in claim 2, further comprising:

a conduit extending through a wall of the pressure vessel, having a first end communicating with the space enclosed by the inside of the pressure vessel and a second end situated outside of the pressure vessel;

a fitting coupled to form a pressure-tight seal between the wall and the conduit; and a valve coupled between the second end of the conduit and the pressurized gas unit, the valve controlling an amount of pressure of the gas to a preselected value.

4. An apparatus as claimed in claim 3, further comprising:

a four-way conduit having first, second and third valved legs, and a fourth leg coupled to the second end of the conduit; and a vacuum unit coupled to the first valved leg;

the pressurized gas unit coupled to the second valved leg of the four-way conduit, and the first valved leg being opened and the second and third valved legs being closed to evacuate the pressure vessel with the vacuum unit, the first and third valved legs being closed and the second valved leg being opened to supply the pressurized gas to the pressure vessel from the pressurized gas source, and the third valved leg being opened and the first and second valved legs being closed to bleed gas from the pressure vessel.

5. An apparatus as claimed in claim 1, further comprising:

a liquid coolant;

a first conduit extending through a wall of the pressure vessel, the first conduit having first and second ends, the first end of the first conduit situated in the pressure vessel and coupled to supply coolant to the cooling unit to generate the cooled surfaces of the enclosure of the cooling unit;

a first fitting coupled to form a pressure-tight seal between the first conduit and the wall;

a second conduit extending through the wall of the pressure vessel, the second conduit having first and second ends, the first end situated inside of the pressure vessel and coupled to the cooling unit to discharge the coolant from the cooling unit;

a second fitting coupled to form a pressure-tight seal between the second conduit and the wall;

an orifice coupled to communicate with the second conduit, for building up the pressure of the coolant flowing in the cooling unit;

a tank receiving the coolant flow from the orifice;

a refrigeration unit coupled to cool the coolant; and a pump situated outside of the pressure vessel and coupled to drive the coolant to the second end of the first conduit and to receive the coolant from the tank, for circulating the coolant through the cooling unit.

6. An apparatus as claimed in claim 5, wherein the cooling unit includes a manifold defining input and output passages coupled to the first and second conduits, respectively, to receive and expel the coolant flow from the cooling unit; and a plurality of elongated cooling members that are circularly arranged to define the inner side cooling surfaces of the enclosure, the elongated cooling members having input and output conduits defined by coaxial tubes, the cooling members being mounted to the manifold so that the input and output conduits of the cooling members communicate with the input and output passages, respectively, of the manifold, the cooled surfaces of the cooling members that face inwardly toward a center axis of the circular arrangement of the cooling members and a surface of the manifold together defining the enclosure.

7. An apparatus as claimed in claim 6, further comprising:

a protective cylinder fitted in sleeve-like fashion outside of the elongated cooling members, for containing the charge material.

8. An apparatus as claimed in claim 1, further comprising:

a feedthrough extending through a wall of the pressure vessel, and having a first end situated inside of the pressure vessel, coupled to the heating element, and a second end opposite the first end, situated outside of the pressure vessel; and a coolant supply unit coupled to the feedthrough to circulate the coolant through the inductive heating element.

9. An apparatus as claimed in claim 8, further comprising:

a fitting coupled to form a pressure-tight seal between the feedthrough and the wall of the pressure vessel.

10. An apparatus as claimed in claim 8, further comprising:

an electric power generator situated outside of the pressure vessel and coupled to the feedthrough, generating an alternating current that is supplied to the inductive heating element to heat the interior portion of the charge material.

11. An apparatus as claimed in claim 1, wherein the apparatus receives a coolant flow and electric power, the apparatus further comprising:

a feedthrough extending through a wall of the pressure vessel, the feedthrough including a first elongated electric conductor having an inner wall defining a conduit for channeling the coolant flow, and a second elongated electric conductor enclosing a portion of the first conductor in a region in which the feedthrough extends through the wall, the second conductor having an inner wall that is spaced from an outer wall of the first conductor to define a conduit for channeling the coolant flow between the inner wall of the second conductor and the outer wall of the first conductor, the first and second electric conductors having respective first ends coupled inside of the pressure vessel to respective terminals of the heating element, to supply the electric power to the heating element, and coupled to supply the coolant flow to the heating element through one of the first and second conduits, and to receive the return coolant flow from the heating element through the other of the first and second conduits, and the first and second electric conductors having second ends coupled outside of the pressure vessel to receive the electric power, and coupled so that the one of the first and second conduits receives the coolant flow for supply to the heating element, and the other of the first and second conduits outputs the coolant flow from the heating element.

12. An apparatus as claimed in claim 11, further comprising:

an electrical insulator surrounding and contacting the first conductor, to provide electrical insulation between the first and second conductors, an outer wall of the electrical insulator and the inner wall of the second conductor defining the channel between the outer wall of the first conductor and the inner wall of the second conductor.

13. An apparatus as claimed in claim 1, wherein the heating element includes a coil encircling a longitudinal axis of the cooling unit.

14. An apparatus as claimed in claim 1, further comprising;

a support member situated in the pressure vessel and supporting the shield in a position to surround the heating element.

15. An apparatus as claimed in claim 1, further comprising:

at least one bracket mounted to an inside wall of the pressure vessel, the bracket attached to the shield to support the shield.

16. An apparatus as claimed in claim 1, wherein the heating element encircles the cooling unit in a limited region along an axis of the cooling unit, the apparatus further comprising:

an actuator situated in the pressure vessel and coupled to one of the heating element and the cooling unit, and an inner wall of the enclosure, for moving the cooling unit relative to the heating element along the axis so that the melt zone traverses the charge material to form the crystal of the charge material that extends along the axis.

17. An apparatus as claimed in claim 16, wherein the actuator includes a hydraulic fluid;

a hydraulic device situated inside of the pressure vessel, mechanically coupled between one of the heating element and the cooling unit, and the inner wall of the pressure vessel, for moving the heating element relative to the cooling unit, based on a flow of the hydraulic fluid, a hydraulic pump situated outside of the pressure vessel, and a valve situated outside of the pressure vessel and coupled to receive hydraulic fluid flowing between the device and the pump, the actuator having a preparatory mode of operation in which the pump is actuated to force the hydraulic fluid to move the cooling unit to a first position relative to the heating element, and the actuator having a crystal-growing mode of operation in which the weight of the one of the cooling unit and the heating element, drives the hydraulic fluid out of the device and into the pump at a preselected constant flow rate determined by the valve, so that the cooling unit moves from the first position to a second position relative to the heating element, to form a crystal of the charge material extending between the first and second positions.

18. An apparatus as claimed in claim 1, wherein the pressure vessel includes a chamber member having an open end, and a flange adjacent the open end, a plate member having a flange, supporting the heating element and the cooling unit, a gasket situated between the chamber member and the plate member, and a plurality of bolts for securing the flange of the chamber member to the flange of the plate member so that the open end of the chamber member is enclosed by the plate member and so that the gasket forms a pressure-tight seal between the flanges of the chamber and plate members.

19. An apparatus as claimed in claim 1, further comprising:

a thermal shield supported by the pressure vessel and situated between the heating element and a wall of the pressure vessel, to impede heating of the wall of the pressure vessel.

20. A system receiving a pressurized gas, the system comprising:

a pressure vessel for containing the pressurized gas;

a cooling unit situated in the pressure vessel, having cooled surfaces defining an enclosure with at least one opening;

a charge material positioned inside of the enclosure of the cooling unit and exposed through the opening of the enclosure to pressure exerted by the gas contained in the pressure vessel;

an induction heating element situated in the pressure vessel, for heating an interior portion of the charge material to form a melt zone that is contained by a relatively cool, exterior portion of the charge material that is closer relative to the melt zone, to the cooled surfaces of the cooling unit; and a shield arranged between the heating element and a wall of the pressure vessel the shield preventing radio-frequency (rf) radiation generated by the induction heating element from significantly heating the pressure vessel's wall.

21. A system as claimed in claim 20, wherein the charge material includes at least one of GaN, AlN, SiC, $YBa_2Cu_3O_x$ and $AlGaN_x$.

22. A system as claimed in claim 20, wherein the charge material is composed of a substance that undergoes a peritectic reaction at atmospheric pressure.

23. A system as claimed in claim 20, wherein the charge material includes susceptor material to facilitate melting of the interior portion of the charge material.

24. A method comprising the steps of:

a) containing a molten liquid portion of a charge material, in a skull composed of a solid portion of the charge material; and b) pressurizing at least the molten liquid portion of the charge material with a gas at a pressure in excess of one-hundred atmospheres, during the performance of the step (a).

25. A method as claimed in claim 24, further comprising the step of:

c) cooling the molten liquid portion of the charge material to solidify the charge material to form a crystal, during the performance of the step (b) of pressurizing.

26. A method comprising the steps of:

a) heating an interior portion of a charge material body to melt the interior portion with radio-frequency (rf) radiation;

b) during performance of the step (a), cooling an exterior portion of the charge material body so that the exterior portion is in a solid phase and contains the molten interior portion;

c) pressurizing the charge material body in a pressure vessel with a gas during performance of the steps (a) and (b), and d) shielding the pressure vessel from the rf radiation generated in the step (a).

27. A method as claimed in claim 26, further comprising the step of:

d) cooling the molten interior portion of the charge material body to form a solid-phase crystal of the charge material.

28. A method as claimed in claim 27, wherein the step (a) of heating the charge material body is performed by a heat source in a limited area along an axis of the charge material body, the method further comprising the step of:

e) moving the heat source relative to the material body, along the axis of the material body, the step (d) of cooling the interior portion of the charge material body occurring along the axis of the charge material body in a region of the material body previously heated by the limited heated area as the heat source moves along the axis of the charge material body.

29. A method as claimed in claim 28, wherein said step (e) is performed at a rate of at least one millimeter per hour.

30. A method as claimed in claim 26, wherein the shielding in the step (d) is performed so as to direct the rf radiation to the charge material body.

31. An apparatus as claimed in claim 1, wherein the shield reflects at least some rf radiation away from the pressure vessel's wall.

32. An apparatus as claimed in claim 1, wherein the shield reflects at least some of the rf radiation toward the charge material contained in the cooling unit.

33. An apparatus as claimed in claim 1, wherein the shield is electrically conductive.

34. An apparatus as claimed in claim 33, wherein the shield is electrically coupled to an end of the heating element.

35. An apparatus as claimed in claim 34, wherein one end of the heating element is electrically grounded.

36. An apparatus as claimed in claim 1, wherein the shield has a cylindrical wall that surrounds the heating element.

37. An apparatus as claimed in claim 1, wherein the shield is formed of metal.

38. An apparatus as claimed in claim 37, wherein the metal includes copper.

39. A method as claimed in claim 24, wherein said step (b) is performed above one-hundred-and-fifty atmospheres of pressure.

40. A method as claimed in claim 26, wherein said step (c) is performed above one-hundred atmospheres of pressure.

41. A method as claimed in claim 26, wherein said step (c) is performed above one-hundred-and-fifty atmospheres.

42. A method as claimed in claim 26, wherein the shielding of said step (d) is performed so as to direct at least some radiation toward the charge material body.

43. An apparatus for growing a crystal from a charge material, the apparatus coupled to receive electric power and coolant, the apparatus comprising:

a pressure vessel for containing a pressurized gas;

a cooling unit for situation in the pressure vessel, having cooled surfaces defining an enclosure to receive the charge material;

an induction heating element for situation in the pressure vessel, for heating an interior portion of the charge material to form a melt zone that is contained by a relatively cool, exterior portion of the charge material that is closer relative to the melt zone, to the cooled surfaces of the cooling unit, the heating element defining a conduit having two opposite terminal ends through which the coolant passes; and a feedthrough extending through a wall of the pressure vessel, and having a first end situated inside of the pressure vessel, that is coupled to the heating element, and a second end opposite the first end, situated outside of the pressure vessel, the feedthrough having first and second conductors that are coaxial at least in a portion of the feedthrough that extends through the pressure vessel wall, the first and second conductors of the feedthrough coupled to respective ends of the heating element to supply the electric power to the heating element and to circulate the coolant through the heating element.

44. An apparatus as claimed in claim 43, further comprising:

a fitting coupled to form a pressure-tight seal between the feedthrough and the wall of the pressure vessel.

45. An apparatus as claimed in claim 43, wherein the seal formed by the fitting can withstand a pressure above one-hundred atmospheres.

46. An apparatus as claimed in claim 43, wherein the seal formed by the fitting can withstand a pressure above one-hundred-and-fifty atmospheres.

47. An apparatus as claimed in claim 43, further comprising:

a coolant supply unit coupled to circulate the coolant through the inductive heating element.

48. An apparatus as claimed in claim 43, further comprising:

an electrical insulator surrounding and contacting the first conductor, to provide electrical insulation between the first and second conductors, an outer wall of the electrical insulator and the inner wall of the second conductor defining the channel between the outer wall of the first conductor and the inner wall of the second conductor.

* * * * *